United States Patent [19]

Anderson et al.

[11] 4,414,606
[45] Nov. 8, 1983

[54] DEFOAMING ELECTRONIC HARDWARE

[75] Inventors: Edward A. Anderson, Yorba Linda; Benjamin Bennett, Beverly Hills; Billy D. Gray, Hermosa Beach, all of Calif.

[73] Assignee: Hughes Aircraft Company, El Segundo, Calif.

[21] Appl. No.: 274,011

[22] Filed: Jun. 15, 1981

[51] Int. Cl.³ .......................... H05K 1/16; H05K 3/00
[52] U.S. Cl. ..................................... 361/397; 29/829; 29/402.03; 29/402.06; 29/402.08; 174/52 PE
[58] Field of Search ........... 29/402.01, 402.03, 402.06, 29/402.08, 402.11, 402.18, 837, 829; 284/46.6, 46.4; 53/472; 174/52 PE; 361/395, 399, 397

[56] References Cited

U.S. PATENT DOCUMENTS

| 3,616,533 | 11/1971 | Heap et al. | 29/837 |
| 3,641,725 | 2/1972 | Grisell | 264/46.6 X |
| 3,869,563 | 3/1975 | Ocken, Jr. | 53/472 X |
| 3,952,082 | 4/1976 | Arnaud | 264/46.6 |

FOREIGN PATENT DOCUMENTS 1448674 9/1976 United Kingdom ........... 174/52 PE

OTHER PUBLICATIONS

A removable Encapsulant–Polystyrene Foam by K. B. Wischmann et al., SAMPE Journal, Mar./Apr., 1977, pp. 15-19.

Primary Examiner—Mark Rosenbaum
Assistant Examiner—Carl J. Arbes
Attorney, Agent, or Firm—Lewis B. Sternfels; William J. Bethurum; A. W. Karambelas

[57] ABSTRACT

Printed wiring board assemblies (12) and the like encapsulated in foam (28) may be removed by use of a pair of sandwich structures (30) placed about the assembly. Each sandwich structure includes a pair of perforated sheets (36) with a sinuously extending filament (40) sandwiched between the sheets. Defoaming is effected by pulling the filament from the foam through the intermediary of a tool grasping ends (52) of the filament.

12 Claims, 6 Drawing Figures

DEFOAMING ELECTRONIC HARDWARE

BACKGROUND OF THE INVENTION

1. Field of the Invention

The present invention relates to means and method for freeing electronic hardware from its encapsulation in foam.

2. Description of the Prior Art

Electronic hardware is sometimes encapsulated in foam when it is necessary to isolate it from vibration or other environmental conditions which could adversely affect or damage the hardware. However, such encapsulation is so effective to protect the hardware that it becomes extremely difficult and time consuming to free the hardware from the foam for rework or replacement. Conventionally, a worker digs, picks, carves, slices and fractures the foam around the hardware in order to isolate it from the remainder of the encapsulating foam. Such a procedure is extremely tedious, and it is possible to damage the hardware if extreme care were not taken. The greatest drawback, however, is the time required to free a specific piece of hardware from the foam. For example, a very highly skilled worker requires at least one-half hour to remove a microelectronic circuit assembly module (MICAM) stick, which is similar to a small printed circuit board assembly, having approximate dimensions of 4½ inches in length, 1 inch in height, and ½ inch in thickness from its encapsulation. For lesser skilled workers, a similar defoaming operation might entail two or more hours. It is obvious that the delay in fabrication of a working electronic unit and time involved is costly.

SUMMARY OF THE INVENTION

The present invention avoids and overcomes these and other problems by utilizing a medium which is embedded in the foam and used to cut through portions of the foam adjacent the hardware. Specifically, the cutting medium comprises a sinuously placed filament placed between a pair of guides to form a sandwich structure. One such structure is placed on either side of the hardware. When the filaments are pulled from the foam, they slice through the foam to leave the hardware free from the remaining foam.

Several advantages flow therefrom. The time utilized in the defoaming operation is considerably reduced by at least a factor of five. The cuts formed in the foam are evenly made and permit easy removal and later replacement or repair of the hardware. Damage to the hardware and adjacent hardware is virtually eliminated.

Other aims and advantages as well as a more complete understanding of the present invention will appear from the following explanation of an exemplary embodiment and the accompanying drawings thereof.

DETAILED DESCRIPTION OF THE INVENTION

Figure 1:
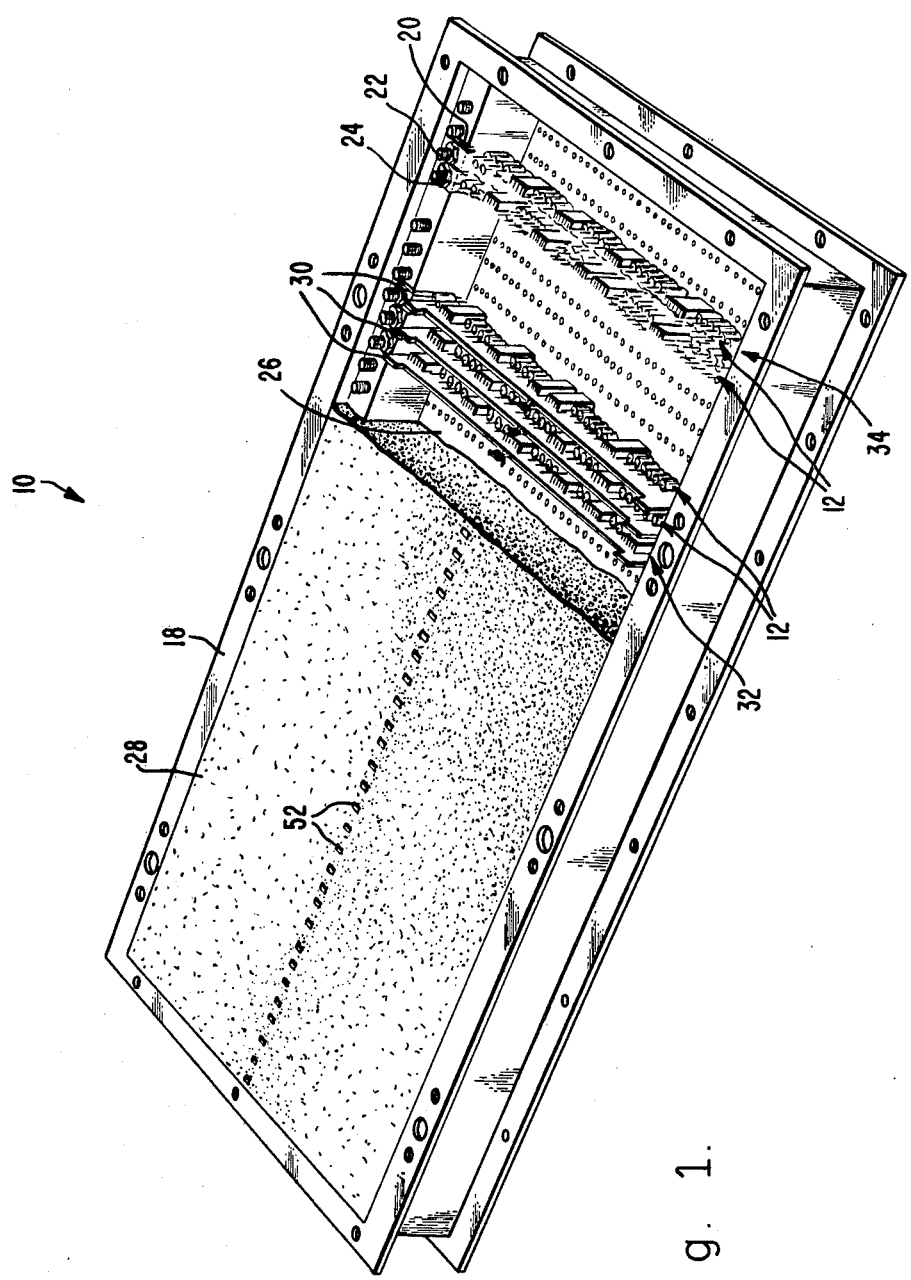
FIG. 1 is a perspective view of foam encapsulated hardware, with a portion of the foam removed for visibility of the encapuslated parts.

Accordingly, an encapsulated electronic device 10 comprises a plurality of electronic hardware 12 configured as a microelectronic circuit assembly module (MICAM stick)14 or as a printed circuit board (see also FIGS. 2 and 3) having electronic components 16 electrically coupled and assembled thereon. The electrode hardware is mounted within a frame 18 by use of angle supports 20 at opposite ends of each printed wiring board. The supports have holes through which threaded posts 22 on frame 18 are inserted. Nuts 24 secure angle brackets 20 to posts 22. The printed wiring boards are mounted as shown and abut at one of their edges against a header board 26. Electrical couplings from components 16 and printed wiring board 14 extend through holes in header board 26 to be intercoupled with other printed wiring boards and external hardware.

In order to protect the electronic hardware from vibration and other possibly damaging conditions, the electronic hardware is encapsulated by a foam 28 within frame 18. Such foams are well-known and comprise a form of expandable material which is captured within frame 18 and top and bottom plates which are bolted to the frame. For purposes of illustration, the plates are removed and not shown, and a portion of the foam is likewise removed to expose the electronic hardware as well as the means of the invention by which such hardware may be freed from the foam.

Such means comprise a sandwich structure 30. For convenience and to distinguish between electronic hardware 12 and the sandwich structure, that grouping identified by indicium 32 in FIG. 1 comprises both electronic hardware 12 and sandwich structure 30 while grouping 34 has the sandwich structure removed so that the electronic hardware only is seen. A single MICAM stick electronic hardware 12 with a pair of sandwich structures 30 are illustrated in FIGS. 2 and 3 in greater detail.

Figure 3:
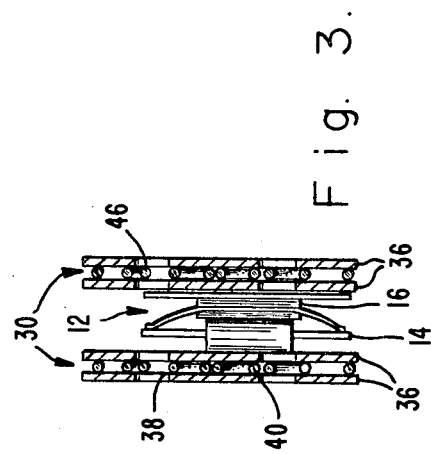
FIG. 3 is a cross-sectional view of the arrangement depicted in FIG. 2, taken along lines 3—3 thereof.
Figure 2:
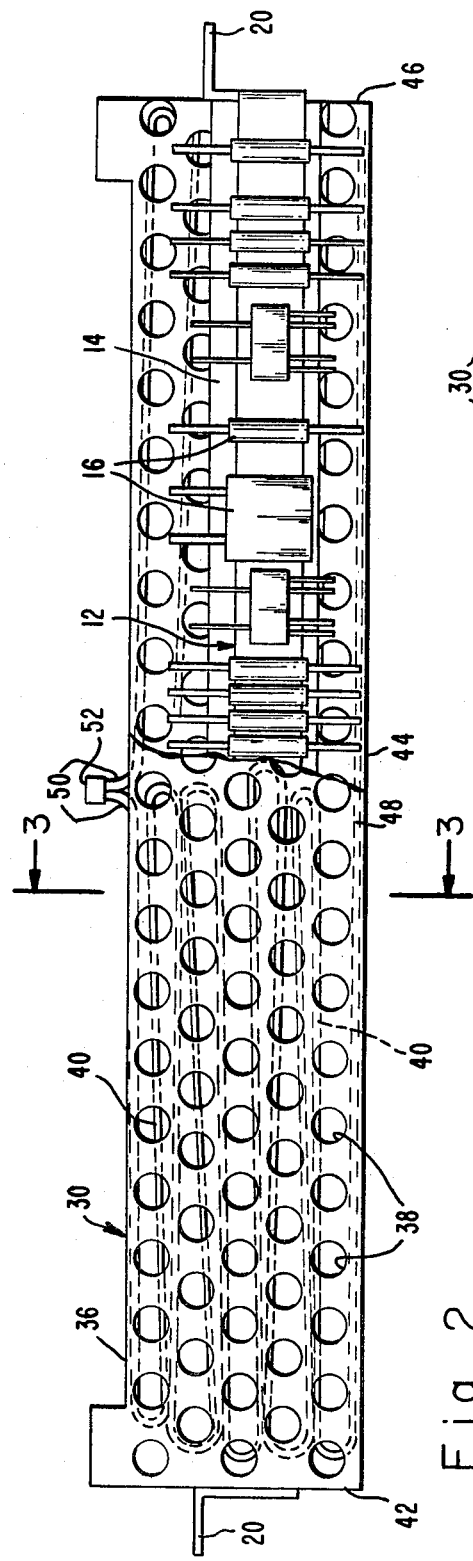
FIG. 2 is a side elevational view, with a portion thereof cut away, illustrating a circuit assembly and defoaming apparatus used in FIG. 1.

As shown in FIG. 3, one sandwich structure 30 is placed on either side of the printed wiring board so that each printed wiring board and its components are physically separated from an adjacent printed wiring board and its components by a sandwich structure 30 (see also FIG. 1). Each sandwich structure comprises a pair of perforated sheets 36, with the perforations comprising a plurality of holes 38. Sheets 36 may comprise any suitable plastic laminate. Because of the perforations, foam passes through the double laminates to secure the same in place.

The sandwich structure also includes a filament 40 such as of metallic, inorganic or orgnaic material. A suitable material comprises a conventional nylon fishing wire of about 30 pound test minimum. Filament 40 may be placed in any convenient manner between a pair of sheets 36; however, it is preferred that the filament extends in a double sinuous manner in two groupings clear of the perforations, although as shown in FIG. 2 the filaments are not clear of the perforations. In one grouping the sinuously extending filament moves back and forth within one-half of the sandwich structure between one edge 42 toward the sandwich's center 44 and, likewise, the other grouping extends back and forth between center 44 and the other end 46 of structure 30. The filament is usually a single piece with its bottom portion 48 extending fully between ends 42 and 46 adjacent header board 26. It is to be understood, however, that configurations other than a sinuous configuration may be employed, and that more than one filament may be used. Ends 50 of the filament are terminated above sheets 36 and are joined together by any convenient means, such as by a colored sleeving 52, which is also embedded just under the surface of the foam. It is desirable that the color of sleeving 52 be different from that of foam 28 in order that the sleeving be easily seen by a worker to facilitate access to the filaments and, therefore, the electronic hardware and components.

Figure 4:
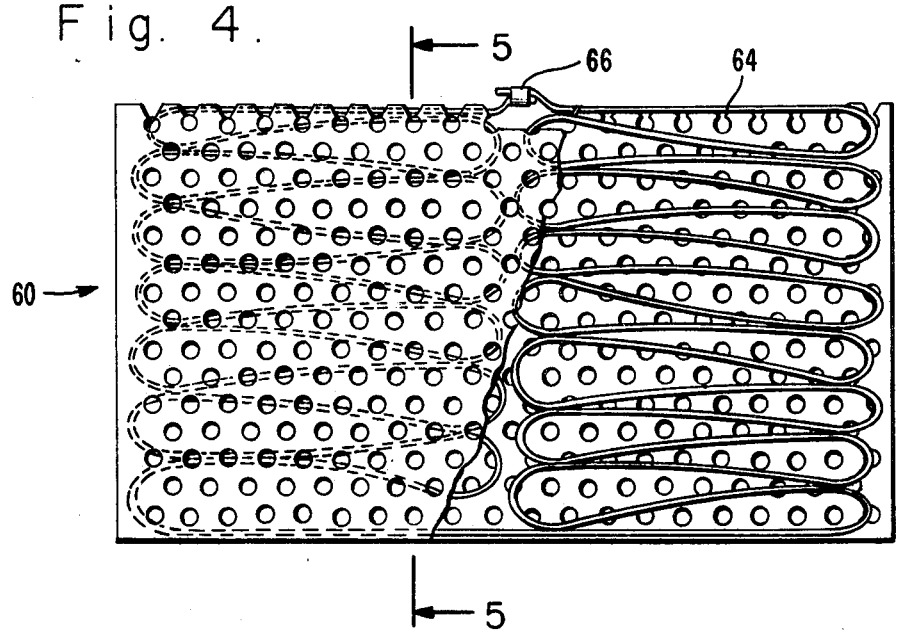
FIGS. 4 and 5 are views of apparatus similar to that shown in FIGS. 2 and 3, with FIG. 5 being a section taken along lines 5—5 of FIG. 4.
Figure 5:
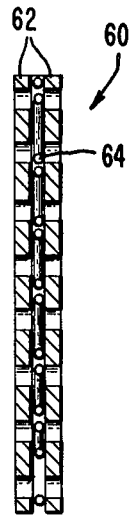

A similar arrangement of a sandwich structure 60 is depicted in FIGS. 4 and 5 for a larger printed wiring board assembly. In a manner similar to that shown in FIGS. 2 and 3, sandwich structure 60 includes a pair of perforated sheets 62 with a sinuously extending filament 64 which is secured together at its ends by a sleeving 66.

Figure 6:
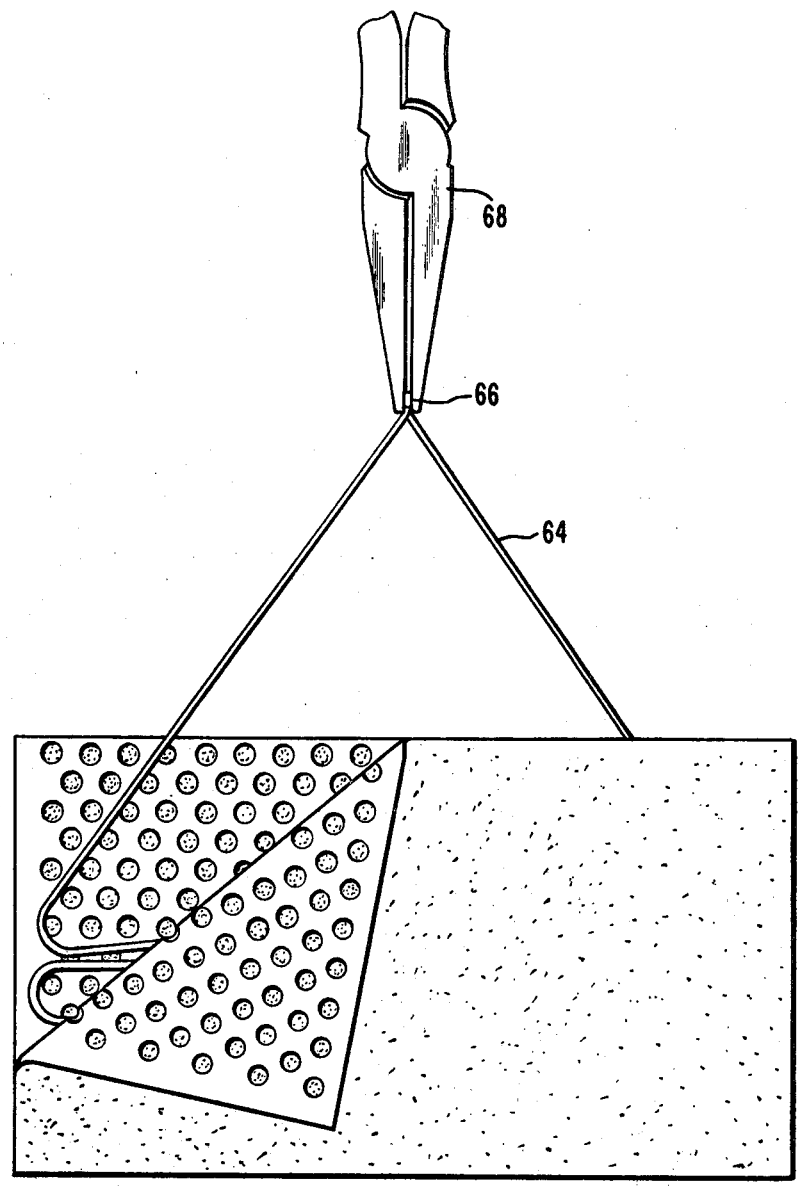
FIG. 6 illustrates use of the apparatus of FIGS. 4 and 5 for freeing electronic hardware from surrounding foam.

To free any one electronic hardware from its foam encapsulation, it is merely necessary to grasp sleeving 52 or 66, as depicted in FIG. 6, by a suitable tool 68, here illustrated as a pliers. To afford access to the sleeving, a small portion of the foam, if need be, is removed so that the tips of the pliers may grasp and remove the sleeve exposing the filament ends. The ends may be pulled together or singly. Upon upward pulling of the pliers, filament 64 is caused to follow and to slice through the foam. Once the foam is fully cut on both sides of the piece of electronic hardware which needs repair or replacement, nuts 24 are removed from posts 22 and any electrical connections and soldering on the reverse side of heater 26 are removed so that the printed wiring board 12 may be lifted from frame 18. A new or reworked electronic hardware is then reattached and recoupled electrically and new foam is set in place to encapsulate the new structure.

Although the invention has been described with reference to particular embodiments thereof, it should be realized that various changes and modifications may be made therein without departing from the spirit and scope of the invention.

What is claimed is:

1. A method for uninjurious removal of electronic hardware encapsulated in foam, comprising the steps of positioning guided cutting apparatus adjacent the hardware within the foam, and cutting through the foam adjacent the hardware in a guided manner without contact with the hardware by use of the apparatus.

2. A method according to claim 1 further comprising the step of embedding continuous filaments in the foam for defining the cutting apparatus.

3. A method according to claim 2 further comprising the step of circumscribing the hardware by a pair of adjacently placed guides sandwiched about the continuous filaments, in which the guides comprise the guided portion of said guided cutting apparatus.

4. A method according to claim 3 further comprising the step of perforating the guides through which the foam extends to provide weakened areas of the foam portions.

5. In combination, a device with encapsulated electronic hardware, said device being useful for defoaming electronic hardware and being encapsulated in foam comprising foam cutting apparatus and guide means precisely placed adjacent the hardware and embedded in the foam, said foam cutting apparatus adapted to be guided by said means when said cutting apparatus is removed from the foam and simultaneously to precisely cut through the foam in which it is embedded without harmful contact with the hardware.

6. A device according to claim 5 wherein said apparatus comprises a continuous filament.

7. A device according to claim 6 in which said guide means comprises a pair of guides sandwiched about said filament for guiding its removal and for defining the location of the cut through the foam.

8. A device according to claim 7 further including perforations in said guides through which said foam extends to provide weakened areas in the foam.

9. A device according to claim 7 in which said filament extends in a sinuous manner between said guides.

10. A device according to claim 5 wherein the electronic hardware comprises at least one printed wiring board having electronic components electricaly coupled and assembled thereon, further comprising two sandwich structures of said cutting apparatus and said guide means placed on either side of the printed wiring board.

11. A device according to claim 10 in which each of said sandwich structures comprises a pair of perforated sheets placed about a sinuously extending filament, with the foam extending through the perforations in said sheets and about said filament.

12. In combination, a device with encapsulated electronic hardware, said device being useful for defoaming said electronic hardware, said hardware includes at least one printed wiring board having electronic components electrically coupled and assembled thereon and said device being encapsulated in foam, comprising:
  a frame having a header board to which the printed wiring board is coupled at one edge thereof, and
  two sandwich structures placed on either side of the printed wiring board and in the foam, each of said sandwich structures comprising a pair of perforated sheets placed about a sinuously extending filament, with the foam extending through the perforations in said sheet and about said filaments and with said sinuously extending filaments of each of said sandwich structures extending from the header board and through and at least towards the outside the foam for identification and grasping by a filament-pulling tool.

* * * * *